United States Patent
Armistead

[11] 4,010,462
[45] Mar. 1, 1977

[54] SEISMIC PLAYBACK SYSTEM

[75] Inventor: Fontaine C. Armistead, Darien, Conn.

[73] Assignee: Texaco Development Corporation, New York, N.Y.

[22] Filed: Oct. 29, 1973

[21] Appl. No.: 410,735

Related U.S. Application Data

[63] Continuation of Ser. No. 153,078, June 14, 1971.

[52] U.S. Cl. .................. 340/347 DA; 340/15.5 GC
[51] Int. Cl.² ........................................ H03K 13/04
[58] Field of Search ............ 340/347 AD, 347 DA; 235/154; 340/15.5 GC, 172.5

[56] References Cited

UNITED STATES PATENTS

| 3,376,557 | 4/1968 | Godinez | 340/172.5 |
| 3,525,948 | 8/1970 | Sherer et al. | 340/15.5 GC X |

OTHER PUBLICATIONS

Harrison, "IBM Technical Disclosure Bulletin" vol. 5, No. 5, Oct. 1962, pp. 30–31.

Primary Examiner—Charles D. Miller
Attorney, Agent, or Firm—T. H. Whaley; C. G. Ries; Ronald G. Gillespie

[57] ABSTRACT

Hereinafter disclosed is methodology and apparatus for converting wide dynamic amplitude range digital data recorded in floating point digital word form, comprising a binary coded mantissa and a binary coded exponent, to an analog signal, or oscillogram, of compressed dynamic amplitude range. The digital word, occupying a number of binary bit positions, is, in algebraic form, $\pm AG^{-E}$; where A represents the mantissa, or argument, G represents the base, or radix, of the number system used and E represents the exponent. Since the base G is constant at 8, for example, the only binary bits that need to be recorded are those representing the mantissa A and the exponent E. In reconverting the digital data to analog form for making an oscillogram, or wiggle trace, it is proposed to compress the dynamic range and, yet, at the same time avoid introducing serious distortion. Apparatus for performing the aforesaid changes, among other things, is disclosed.

4 Claims, 3 Drawing Figures

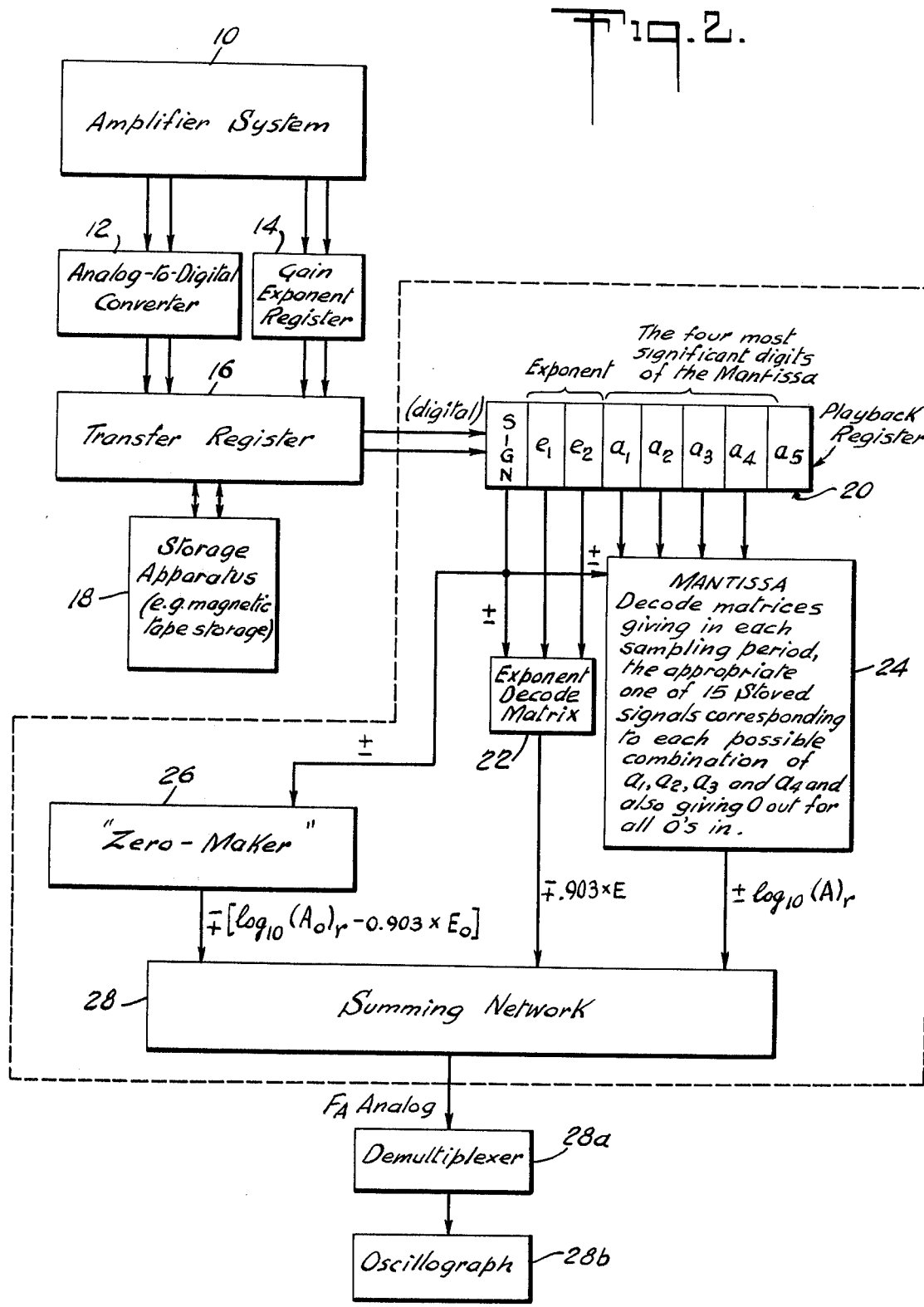

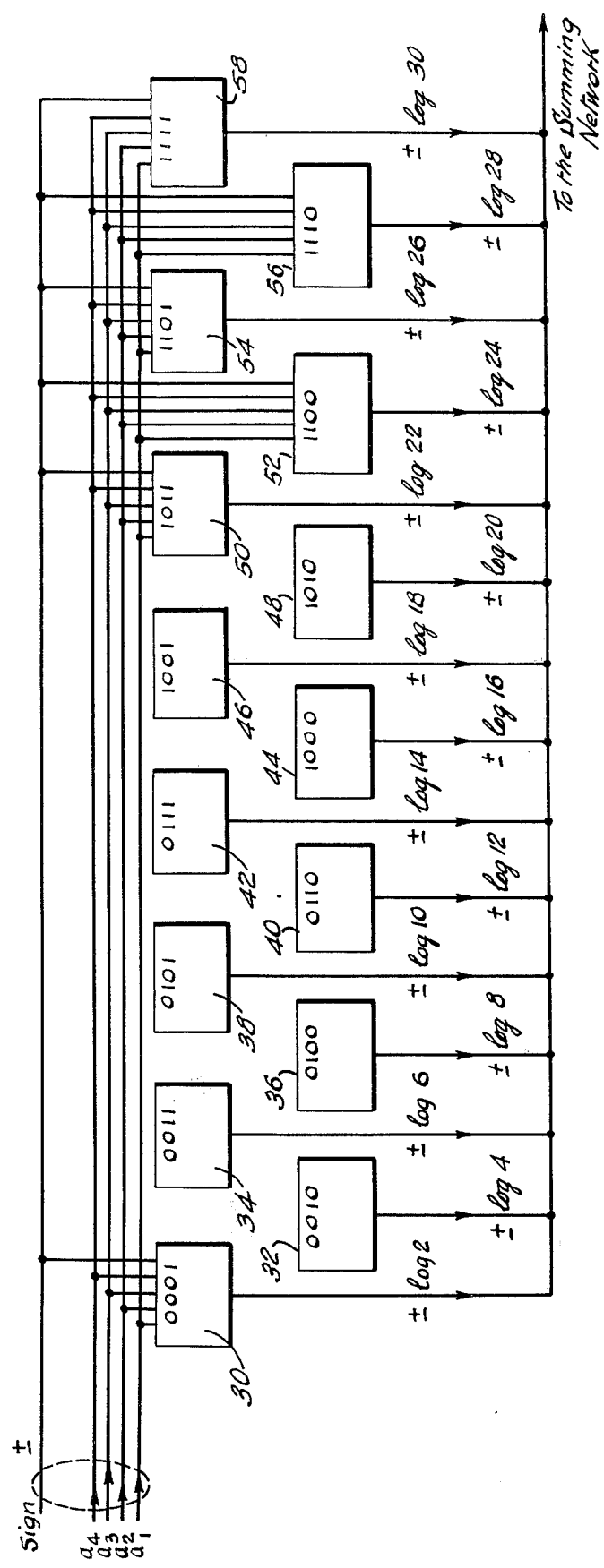

SEISMIC PLAYBACK SYSTEM

This is a continuation, of application Ser. No. 153,078, filed June 14, 1971.

BACKGROUND OF THE INVENTION

This invention pertains, in general, to making analog form playbacks from digitally recorded data (e.g., seismic data) which has been digitized from wide dynamic amplitude range analog from data signals initially generated by transducers, such as geophones in response to acoustically induced seismic disturbances; and, in particular, to the making of analog form playbacks such as oscillograms (or wiggle traces as they are often called by those engaged in seismic work) which are approximate, but very useful, reproductions in compressed range of the wide dynamic range amplitude-versus-time characteristic curves of the analog signal initially generated by the aforesaid transducers or geophones.

For example, in seismic exploration work each acoustically driven geophone generates wide dynamic amplitude range signals in analog form. When such signals are processed through a digital seismic recording system of the type disclosed in the patents and patent application hereinafter identified there is produced a high fidelity record, in digital form, covering the wide dynamic range of amplitudes of the signals. The reason that the digital form record is referred to herein as a high fidelity record is because the signal amplitudes are recorded accurately throughout their wide dynamic range; e.g. a plurality of binary bit positions are used to accurately record the highest signal amplitudes as well as the lowest where the range (i.e., the ratio of highes amplitudes to the lowest) may be of the order of $10^6$. The invention hereinafter disclosed provides methodology and apparatus for making analog form oscillograms, or wiggle traces, from the recorded digital data. The oscillograms, or wiggle traces, are of relatively lower fidelity than the aforementioned digitally recorded data. Although, said oscillograms are of relatively lower fidelity, serious distortions are, nevertheless, not introduced in reconverting the digital data to analog form data.

The recordation in digital form of wide dynamic amplitude range analog form signals initially generated by geophones is disclosed in, among others, the following: U.S. Pat. No. 3,241,100 granted Mar. 15, 1966 in behalf of R. J. Loofbourrow and entitled "Digital Seismic Recording System"; U.S. Pat. No. 3,264,574, granted Aug. 2, 1966, in behalf of R. J. Loofbourrow and entitled "Amplifier system;" and, U.S. Pat. application Ser. No. 786,706, filed Dec. 24, 1968 in behalf of James R. Vanderford and entitled "Amplifier System."

Although the invention is hereinafter described as being employed in conjunction with digital seismic recording systems such as those disclosed in the patents and patent application hereinbefore identified it is, nevertheless, to be understood that the invention's field of use is not limited to seismic data processing.

As is disclosed in the patents and patent application herein disclosed the problem solved is the problem of accurately recording seismic data which in analog form has a dynamic range of amplitudes which is extremely wide. For example, a typical analog signal level for a reflection seismic record runs from several volts of amplitude at its maximum, at the early shock portion of the record, to less than a single microvolt at the end of the seismic record when very low amplitude seismic disturbances are detected. To put it very generally, the aforementioned patents and patent application solve the problem by converting the wide dynamic amplitude range analog signals to digital form. When converted to digital form, occupying a relatively large number of binary bit positions, the full dynamic amplitude range of the analog signal initially generated by a geophone is preserved in recorded form on magnetic tape. Advantageously, the magnetically recorded digital data may subsequently be delivered to an electronic computer for further processing. Some ways and some purposes for which such digital data are subsequently processed in an electronic computer are disclosed in an article "Tools For Tomorrow's Geophysics" by Milton B. Dobrin and Stanley H. Ward, published in the journal "Geophysical Prospecting," Vol. X, pages 433–452 (1962).

In the aforementioned patent application of Vanderford there is described a system wherein portions of an analog signal are converted to digital words where each digital word occupies a number of binary bit positions. Moreover, each such digital word is recorded in a floating point form. Advantageously, the floating point form, or notation, allows greater flexibility of operation and easier handling of numbers differing greatly from each other in magnitude. (See, for example, the textbook "Digital Computer Primer" by E. M. McCormick, 1959, published by McGraw-Hill Book Co., Inc., beginning at page 152). In the system disclosed in the Vanderford patent application a floating point digital number, or word, in the form of a mantissa and an exponent is recorded on magnetic tape. The floating point digital number represents the instantaneous absolute seismic voltage amplitude as it enters the floating point amplifier system disclosed by Vanderford. The dynamic range of the floating point digital number, or word, may be in excess of 200 db, if necessary, to cover the dynamic amplitude range of input signals (equivalent to a 36 binary bit digital number, or word). As a specific example, the floating point word as set forth in conventional algebraic form is as follows:

$$Q_1 = \pm AG^{-E} \quad \text{(Equation 1)}$$

where $Q_1$ represents the absolute magnitude or amplitude of the floating point word; A represents the mantissa, or argument, portion of the word; G represents the base of the number system used (G = 10 in the decimal, or base 10, system or G = 8 in the octal system); and E represents the exponent.

As is suggested in the Vanderford patent application the floating point digital word is in the form:

$$Q_2 = \pm A8^{-E} \quad \text{(Equation 2)}$$

where $Q_2$ represents the absolute magnitude of the amplitude of the input signal to an arrangement of amplifiers, each of which has a gain of 8 and, hence, the base G in equation 1 becomes an 8 in equation 2; the mantissa A represents in binary form (i.e., where the radix or base, of such a number system is 2) and where the exponent E is represented in binary form based on the radix, or base, 8. Of the 18 bits required: 1 bit represents the sign, allowing for bipolar input-output capabilities; 14 bits represent the mantissa; and, 3 bits represents the exponent.

Although there are many advantages (some of which are set forth in the aforementioned published article of Dobrin and Ward) to recording seismic signals in digital form there still remains the need to make available to the seismic prospector a visible record of the seismic data, or portions of it. Conventionally, the visible record is an oscillogram, or wiggle trace as it is often called by seismic prospectors. Often, it is desirable for a seismic prospector in a seismic field crew in a remote location from a main data processing center to take a quick look at a portion of the seismic data from time to time; i.e., look at wiggle traces. For example, a seismic prospector may wish to make some interpretations with respect to the wiggle trace data after coordinating such data with geological data.

The invention, hereinafter disclosed and illustrated in the accompanying drawing figures, is particularly concerned with converting the recorded digital data to the familiar wiggle trace form on recording paper. The recording paper allows about 40 db dynamic amplitude range while the digitally recorded floating point word may have a dynamic range of 156 db, or more. Thus, in converting from digital form to a practical analog form attenuation of the various amplitudes must occur. In such a conversion distortion is necessarily introduced. However, the methodology of the present invention minimizes such distortions and, as a result, there is provided analog form data in the form of oscillograms, or wiggle traces, which provide useful information to seismic prospectors.

SUMMARY OF THE INVENTION

One object of the present invention is to convert data from a digital form to an analog form.

Another object of the present invention is to provide new and useful methodology for converting data from digital form to analog form.

Another object of the present invention is to provide new and useful apparatus for converting data from digital form to analog form.

Another object of the present invention is to convert wide dynamic amplitude range digital data, e.g., seismic data, to analog form oscillograms, or wiggle traces.

Another object of the present invention is to convert wide dynamic amplitude range digital data to analog form data, such as oscillograms, which oscillograms are attenuated reproductions of wide dynamic amplitude range analog signals extant prior to their conversion to said digital data.

Another object of the present invention is to convert wide dynamic amplitude range digital form data to analog form data having attenuated amplitudes without introducing serious distortion.

Briefly, in accordance with the invention a recorded floating point digital word, occupying a number of binary bit positions, and having the general algebraic form $\pm AG^{-E}$ (equation 1) is converted to a different algebraic form in order to produce corresponding analog signals having a range of amplitudes which are attenuated.

Other objects as well as the various features and advantages of the invention will become apparent from the following description when considered in connection with the accompanying drawings which form a part of this specification.

BRIEF DESCRIPTION OF THE DRAWINGS

FIG. 2 is an illustration in block diagram form of one way of implementing the invention.

FIG. 3 is a blockdiagram showing in more detail the mantissa decode matrices of FIG. 2.

DESCRIPTION OF THE PREFERRED EMBODIMENT(S)

Figure 1:
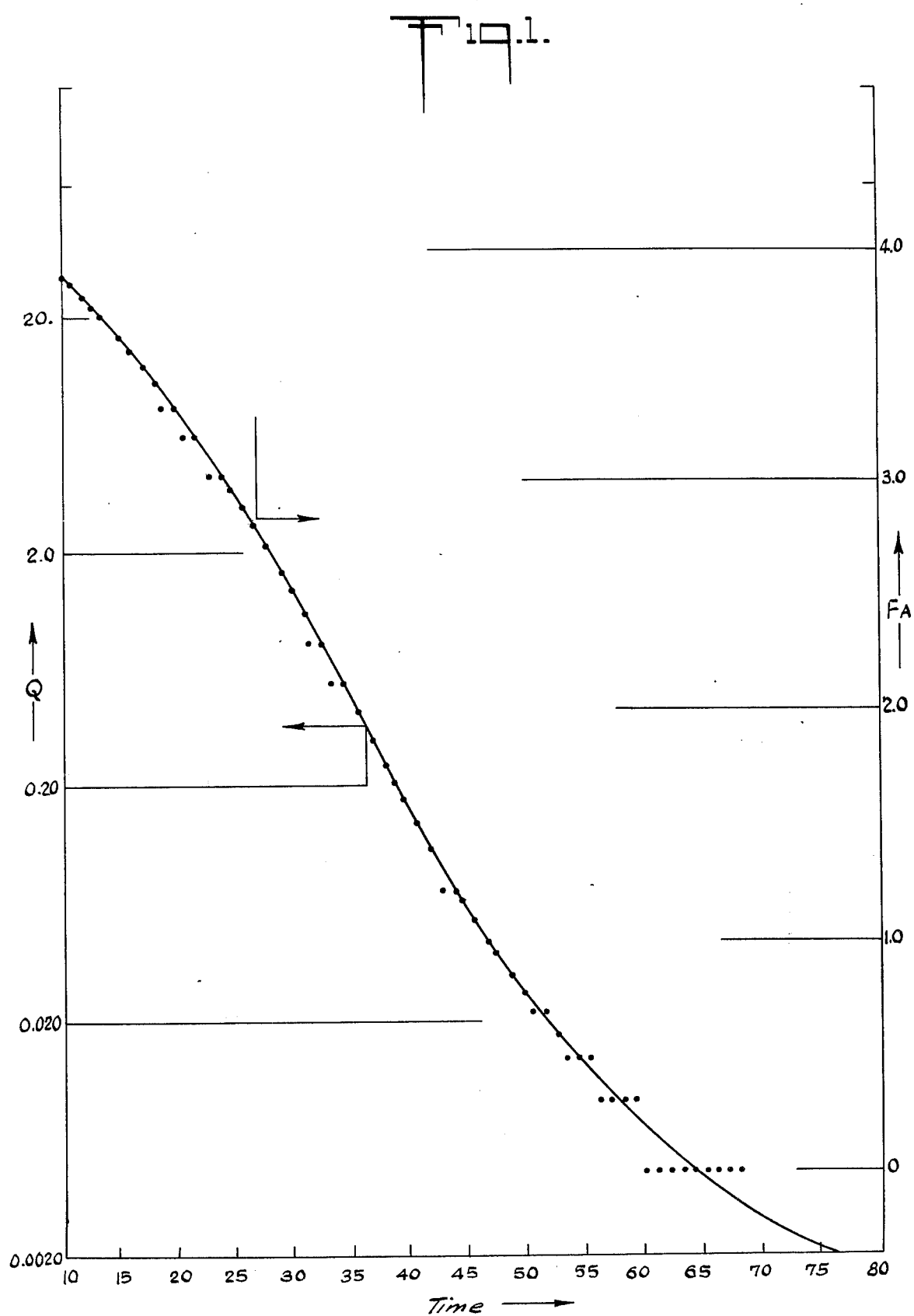
FIG. 1 is a graphical illustration showing a solid line partial oscillogram, or wiggle trace, of part of a seismic record. In addition there is illustrated a continuum of plotted points, the curve, or trace-like, arrangement of which fairly approximates the general form, or shape, of the solid line partial oscillogram. The axis of abscissas is scaled in equal units of elapsed time. For the solid line oscillogram, or trace, the axis of ordinates, on the left hand side of the graph, is logarithmically graduated in units of magnitude, or amplitude Q. For the continuum of plotted points the axis of ordinates, on the right hand side of the graph, is linearly graduated in units of magnitude, or amplitude $F_A$. The solid line partial oscillogram, or trace, represents a portion of an actual, ideal, undistorted analog signal which, conceptually, might be generated by a geophone. The solid line trace if shown in its entirety would cover a dynamic range of amplitudes of the order of $10^6$ and, hence, for the practical purpose of illustrating the trace, and the invention herein disclosed, only a relatively small portion of the solid line trace is illustrated.

The approach according to the present invention is to convert the digital data represented by equations 1 and 2 to logarithmic form in order to compress the dynamic range of amplitudes and in so doing to avoid serious distortions. Converting equation 1 to logarithmic form (Logarithms to the base 10) yields the following:

$$\log Q_3 = \log A - E \log G \qquad \text{(Equation 3)}$$

And, where the base, or radix, G is equal to 8 as in equation 2, then the following equation is obtained:

$$\log Q_4 = \log A - 0.903 E \qquad \text{(Equation 4)}$$

If, for example, the exponent E ranges from 1 to 5 only a small number of values for E are required and hence circuitry to generate values for the second term (0.903 E) of equation 4 is relatively uncomplex.

In accordance with one aspect of the present invention the number of storage locations for the converted seismic data is reduced to a minimum. In this connection it is proposed to represent the logarithm (to the base 10) of all values of the mantissa A, by reducing the number of bits or digits that have to be used for representing all expected values of the mantissa A, with the result of reducing the number of separate values that must be stored for representing all expected values of A. The method of limiting or reducing the number of bits or digits is based on a "rounding off" procedure. For example, the decimal number 93 is rounded off to the decimal number 90. As another example the binary number 1011 (decimal number 11) is rounded off to the binary number 1010 (decimal number 10). Each such rounding off of a single bit or digit, which is accomplished by replacing the least significant bit or digit by a 0, reduces the number of bits or digits to be stored in order to represent all the expected values of log A. Thus, if the mantissa A is represented by a 5 bit binary number, then 32 different values for log A have to be dealt with. However, by rounding off to the next lower multiple of 2, there is obtained a fairly good approximation of log A and, at the same time, the number of values for log A is reduced to 16. As will appear hereinafter with reference to the drawings, 16 different decode matrices (digital-to-analog converters) may be employed to generate any one of 16 different signals representing log A as represented by the first four (i.e. the four most significant) bits of the 5 bit binary number representing the mantissa A.

Before developing equations 3 and 4 to any further extent, terminology to be used hereinafter is defined. $(A_d)_{rd}$ means the mantissa A is expressed in decimal notation and then "rounded off" in decimal form; i.e. "rounded off" to the next lower multiple of 2.

$[(A)_{rb}]_d$ would mean that A is "rounded off" in binary form, i.e., to the next lower multiple of 2 and then expressed in decimal form. $A_r$ means that the mantissa A has been rounded off in general terms.

In order to illustrate the aforementioned rounding off method and its effect on the logarithmic quantities involved, and also to illustrate the use of the terminology defined above, the following tables, Table I and Table II, are included for some selective values of the mantissa A.

TABLE I

| $A_d$ | log $A_d$ | $[(A_d)_{rd}]_d$ | log $[(A_d)_{rd}]_d$ |
|---|---|---|---|
| 102 | 2.01 | 100 | 2.00 |
| 94 | 1.97 | 90 | 1.95 |
| 83 | 1.92 | 80 | 1.90 |
| 71 | 1.85 | 70 | 1.85 |
| 65 | 1.81 | 60 | 1.78 |

Likewise, in the case of binary numbers the log $A_b$ may be represented by the $[(A_b)_{rb}]_d$ where $(A_b)_{rb}$ is obtained by replacing the least significant binary bit with a 0; i.e., rounding off to the next lower multiple of 2, as follows:

TABLE II

| $A_b$ | $A_d$ | log $A_b$ = log $A_d$ | $(A_b)_{rb}$ | $[(A_b)_{rb}]_d$ | log $(A_b)_{rb}$ |
|---|---|---|---|---|---|
| 10001 | 17 | 1.23 | 10000 | 16 | 1.20 |
| 01111 | 15 | 1.18 | 01110 | 14 | 1.15 |
| 01011 | 11 | 1.04 | 01010 | 10 | 1.00 |
| 00101 | 5 | 0.70 | 00100 | 4 | 0.60 |

Taking equation 4 above and putting it in "rounded off" form there results:

$$F_d = \log (A)_r - 0.903 E \quad \text{(Equation 5)}$$

where equation 5 is expressed in the decimal number system and where F as defined by equation 5 is approximately equal to log $Q_4$.

In binary notation equation 4 as "rounded off" is:

$$F_b = [\log (A)_{rb} - 0.903 E]_b \quad \text{(Equation 6)}$$

where $F_b$ as defined by equation 6 is approximately equal to log $Q_4$.

Now assuming that values of Q smaller than $Q_0 = A_0 \cdot 8^{-E_0}$ can be dispensed with and that in the function $F_A$, which is generated by the apparatus hereinafter described with reference to FIGS. 2 and 3, it is desired to have $F_A$ positive for all values of Q greater than $Q_0$ and $F_A = 0$ for all values of Q equal to or smaller than $Q_0$. For example, using a modified form of equation 2 where $Q_0 = A_0 8^{-E_0}$ where $Q_0$ is approximately $10^{-6}$ then $A_0 = 0.03$ and $E_0 = 5$. In view of the small value of $Q_0$, $F_A$ can be set equal to zero by the apparatus hereinafter described.

The values of $Q_0$ may be expressed in terms of the maximum value of the negative exponent $E_0$ and the minimum value of the mantissa $A_0$ as follows:

$$\log Q_0 = \log A_0 - 0.903 E_0 \quad \text{(Equation 7)}$$

$$\log Q_0 \cong \log (A_0)_r - 0.903 E_0 \quad \text{(Equation 8)}$$

In order to satisfy the above conditions $$F_A = F - \log Q_0 \quad \text{(Equation 9)}$$

$$F_A = \log (A)_r - \log(A_0)_r - 0.903E + 0.903E_0 \quad \text{(Equation 10)}$$

or $$F_A = \log (A)_r - 0.903 E - [\log(A_0)_r - 0.903 E_0] \quad \text{(Equation 11)}$$

Since equation 7 employs logarithms there will be no zero and, consequently, the bracketed expressed in equation 11 is introduced as a "zero maker" to overcome this difficulty.

FIGS. 2 and 3 are illustrations in block diagram form of one way of implementing the present invention; i.e., generating the function defined by equation 11.

As is illustrated in FIG. 2, the reference number 10 identifies an amplifier system such as the amplifier system disclosed in the Vanderford patent application hereinbefore identified. As indicated output signals from the amplifier system 10 are delivered to an analog-to-digital converter 12 digitizes selected signals from the amplifier system 10. Also, the gain exponent register 14 temporarily stores signals received from the amplifier system 10. From the analog-to-digital converter 12 and from the gain exponent register 14 signals representing the binary bits 1 or 0 are delivered to a transfer register 16. Transfer register 16 temporarily stores the binary bits delivered thereto. As stated hereinbefore with reference to the various equations, since the gain of each stage in the amplifier system 10 is constant at, for example, 8 the only binary bits that need to be processed and recorded are those representing the mantissa A and those representing the exponent E.

In the amplifier system disclosed in the Vanderford patent application, hereinabove identified, it is contemplated that the binary bits stored in transfer register 16 will ultimately be more permanently stored in a storage apparatus 18 such as, for example, on magnetic tape. As is indicated in FIG. 2 by the opposing arrowheads on the lines connecting the transfer register 16 and storage apparatus 18 the storage apparatus 18 can redeliver its stored binary bits back to transfer register 16 for temporary storage for ultimate processing in the manner hereinafter described.

The elements 10, 12, 14, 16 and 18, hereinbefore described, form what is known as the floating point amplifier system, which is described in detail in the Vanderford patent application hereinbefore identified.

Also provided is an additional playback register 20 for, among other things, temporary storage of the binary bits which are received from transfer register 16. As shown in FIG. 2, the playback register 20 includes 1 binary bit position or location for the sign, as labeled; 2 binary bit positions, or locations, for the exponent; and, five binary bit positions, or locations, representing the mantissa. The exponent bit positions are labeled as $e_1$ and $e_2$; the mantissa bit positions, or locations, are labeled as $a_1$, $a_2$, $a_3$, $a_4$ and $a_5$. It is, however, to be understood that many more bit positions may be employed to represent the exponent as well as the mantissa depending the accuracy required.

As in indicated in FIG. 2, a binary bit representative of the sign is delivered from the playback register 20 to an exponent decode matrix 22 as well as to a mantissa decode matrix 24 and to a zero maker circuit 26. As suggested in FIG. 2, two binary bits ($e_1$ and $e_2$) representative of the exponent E are delivered from playback register 20 to element 22.

A bit representative of the sign ($\pm$) delivered from playback register 20 to the zero maker 26 actuates the zero maker 26 to deliver a signal representative of the mathematical function:

$$\mp [\log (A_0)_r - 0.903\, E_0]$$

The bits $e_1$ and $e_2$ which are representative of the exponent E, delivered from the playback register 20 to the exponent decode matrix 22 actuate said matrix to deliver an analog signal representative of the function $\mp 0.903E$.

In addition mantissa decode matrices 24 (see also FIG. 3) accept the binary bits representative of the mantissa ($a_1$, $a_2$, $a_3$, $a_4$) and generate the output function $\pm \log (A_r)$. The output analog signals from zero maker 26, exponent decode matrix 22 and mantissa decode matrices 24 are delivered as shown in FIG. 2 to a summing network 28, the analog output of which is $F_A$. See equation 11.

Exponent decode matrix 22 and the battery of mantissa decode matrices are in effect, digital-to-analog converters as is the zero maker circuit 26.

Shown in FIG. 3 are a group of mantissa decode matrices which comprise the element identified as element 24 in FIG. 2. In FIG. 3 there is illustrated 15 digital-to-analog converters numbered 30 through 58.

As shown in FIG. 3 there is provided the digital-to-analog encoders 30, 32, 34, 36, 38, 40, 42, 44, 46, 48, 50, 52, 54, 56, and 58. The digital-to-analog encoder 30, as well as all the others, are driven by the sign bit $\pm$ and the mantissa bits $a_1$ through $a_4$ (in the rounding off process the bit $a_5$ is equal to zero always). When the mantissa binary bits are equal to the binary number 0001 then the output signal in analog form is equal to $\pm \log 2$. For the digital-to-analog encoder element 32 when the mantissa binary bits are equal to the binary number 0010 then the output signal is equal to $\pm \log 4$. As for the digital-to-analog encoder element 34 when the binary input number generated by the mantissas is equal to 0011 then the output analog signal is equal to $\pm \log 6$. When the digital-to-analog converter element 36 is actuated by the mantissas which generate the binary number 0100 the output analog signal is equal to $\pm \log 8$. When the digital-to-analog converter element 38 is actuated by the mantissas equal to the binary number 0101 then the output analog signal is equal to $\pm \log 10$. When the digital-to-analog converter element 40 is actuated by the mantissa yielding the binary number 0110 the analog output delivered by the encoder element 40 is equal to $\pm \log 12$. When the digital-to-analog converter element number 42 is similarly actuated by the binary number 0111 then the analog output is equal to $\pm \log 14$. When the digital-to-analog converter element number 44 is actuated by the mantissas signaling the binary number 1000 then the analog output is equal to the signal $\pm \log 16$. The digital-to-analog converter element 46 as actuated by the mantissas yielding the binary number 1001 delivers the output analog system $\pm \log 18$. The digital-to-analog converter element 48 when actuated by the binary number 1010 delivers the output analog signal $\pm \log 20$. The digital-to-analog encoding element 50 when actuated by the mantissas delivering the binary number 1011 delivers the output analog signal $\pm \log 22$. The digital-to-analog encoding element 52 when actuated by the mantissas delivering the binary number 1100 delivers the output analog signal log 24. The digital-to-analog encoding element number 54 when actuated by the mantissas delivering the binary number 1101 delivers the output analog signal $\pm \log 26$. The digital-to-analog encoding element 56 when actuated by the mantissas delivering the binary number 1110 delivers the output analog signal $\pm \log 28$. Similarly, the digital-to-analog encoding element 58 when actuated by the mantissas delivering the binary signal number 1111 delivers the analog output signal $\pm \log 30$.

As is suggested in FIGS. 2 and 3, the output from the various digital-to-analog encoding elements 30 through 58 are delivered to the summing network 28 which in turn delivers the analog signal $F_A$ represented by equation 11. Said signal $F_A$ is, in turn, delivered to a demultiplexer 28a and then oscillograph 28b.

FIGS. 2 and 3 as stated hereinbefore show the circuitry in block diagram form which has been devised to implement the generation of the analog signal proportional to the value represented by equation 11. The playback system, per se, is included within the dashed line box shown in FIG. 2. Said playback system accepts into the playback register 20 digital form information with respect to the sign, the exponent (2 digits in the example shown). Summing network 28 delivers an analog signal $F_A$ proportional to the value defined by equation 11 hereinbefore set forth. FIG. 3 shows in detail how the various mantissa decode matrices (digital-to-analog converters) are arranged. Also, FIG. 2 shows the analog signal representing the first term on the right hand side of equation 11 as being delivered to summing network 28 by the various mantissa decode matrices 30 through 58 as $\pm \log (A_r)$. Also shown is the analog signal representing the second term of equation 11 being delivered to summing network 28 by the exponent decode matrix 22 as being $\mp 0.903\, E$.

The third and fourth, or remaining terms of equation 11, are constant for any given condition and are shown in FIG. 2 as being supplied by the zero maker circuit 26. The zero maker circuit 26 delivers to summing network 28 an analog signal proportional to $\mp[\log (A_0)_r - 0.903 E_0]$.

As will appear from FIG. 3 when the sign and the four most significant digits supplied from playback register 20 of FIG. 2 to the mantissa decode matrices are +1111 from digital-to-analog converter element 58 the element 58 will deliver to summing network 28 an analog signal proportional to $+ \log 30$. Also, for example, when the sign and the four most significant digits are −1011 the corresponding binary to decimal encoding element 50 delivers an output analog signal proportional to − log 22. Also it is to be noted that when the four most significant digits are 0000 regardless of the sign or polarity there is no matrix or digital-to-analog converter element corresponding to that particular array of digits and as a result the output analog signal delivered to summing network 28 is 0.

As may be appreciated from FIG. 2 in the other drawings, both positive and negative digital input signals will be faithfully represented by corresponding positive and negative analog signals. When the sign from playback register 20 is positive the analog signal from the mantissa decode matrix 24 is also positive and the analog signals from the exponent decode matrix 22 and from the zero maker circuit 26 are also both negative. When the sign from playback register 20 is negative all the above analog signals are reversed in polarity.

FIG. 1 as intended is an illustration of the effectiveness of the present invention. The solid line curve or trace represents an analog signal ranging in amplitude over four decades ($10^4$) as read on the left ordinate axis which is logarithmically graduated. This wide ranging analog signal shown in FIG. 1 was processed as in a floating point amplifier system to reduce it or compress it to a set of digital A (mantissa) and E (exponent) data using G (base or radix) of 8 employing binary notation. These A and E digitized data were then processed in accordance with the steps of the present invention to produce a narrow ranging analog system which was then plotted on a linear scale. This latter analog linearized signal was found to range only from 0 to 4.0 and to retain the essential shape or form of the original 4 decade analog signal. The points plotted in FIG. 1 represent the final analog signal which are read or interpreted with respect to the right hand ordinate axis which is linearly graduated.

Although specific ways and means of practicing the invention have been described hereinbefore and illustrated in the accompanying drawing figures it is nevertheless to be understood that this has been done for purposes of illustration and that the scope of the invention is not to be limited thereby but is rather to be determined from the claims appended hereto.

What is claimed is:

1. A seismic playback system adapted to receive wide dynamic range seismic signals, comprising means for receiving at least one seismic analog signal; means for converting at least one received seismic signal to digital signals representing the general algebraic equation:

$$Q_1 = \pm AG^{-E}$$

where $Q_1$ represents the amplitude, either positive or negative, of the received seismic signal; A represents a mantissa, G represents a radix, E represents an exponent, and where some of the digital signals represent the four most significant digits of A and some represent E; first means connected to the converting means for decoding the digital signals representative of E to provide an analog signal of one polarity corresponding to E log G, second means connected to the converting means for decoding the digital signals corresponding to the four most significant digits of A to provide a signal corresponding to log A having a polarity opposite to that of the E log G signal; zero-making means connected to the converting means for providing an analog signal Z in accordance with the following equation:

$$Z = \pm [\log_{10}(Ao)_r - 0.903E_o]$$

and having the same polarity as the signal from the first decoding means, where $(Ao)_r$ is a predetermined rounded off minimum value for the mantissa A and $E_o$ is a predetermined maximum value of the exponent E, means connected to the first and second decoding means and to the zero-making means for providing an analog output signal in accordance with the three signals and the following equation:

$$\log Q_1 = \log A - E \log G - Z.$$

2. A system as described in claim 1 in which the signal provided by the first decoding means is representative of a logarithm, $\log (A)_r$, of a rounded off mantissa, and the signal from the second decoding means is representative of a modified exponent 0.903E.

3. A system as described in claim 2 further comprising oscillograph means connected to the $\log Q_1$ signal means for recording the output signal from the $\log Q_1$ signal means.

4. A system as described in claim 2 in which $A_o$ has a value of 0.03 and $E_o$ has a value of 5.

* * * * *